US010153315B2

(12) United States Patent
Mao et al.

(10) Patent No.: US 10,153,315 B2
(45) Date of Patent: Dec. 11, 2018

(54) PHOTOSENSITIVE IMAGING APPARATUS AND METHOD OF FORMING SAME

(71) Applicant: Shanghai Jadic Optoelectronics Technology Co., Ltd., Shanghai (CN)

(72) Inventors: Jianhong Mao, Shanghai (CN); Cheng Xu, Shanghai (CN)

(73) Assignee: SHANGHAI JADIC OPTOELECTRONICS TECHNOLOGY CO., LTD., Shanghai (CN)

( * ) Notice: Subject to any disclaimer, the term of this patent is extended or adjusted under 35 U.S.C. 154(b) by 45 days.

(21) Appl. No.: 15/136,223

(22) Filed: Apr. 22, 2016

(65) Prior Publication Data

US 2016/0315113 A1    Oct. 27, 2016

(30) Foreign Application Priority Data

Apr. 24, 2015    (CN) .......................... 2015 1 0201654

(51) Int. Cl.
*H01L 27/146* (2006.01)

(52) U.S. Cl.
CPC .... *H01L 27/14629* (2013.01); *H01L 27/1463* (2013.01); *H01L 27/1464* (2013.01); *H01L 27/14612* (2013.01); *H01L 27/14625* (2013.01); *H01L 27/14636* (2013.01); *H01L 27/14643* (2013.01); *H01L 27/14685* (2013.01); *H01L 27/14689* (2013.01)

(58) Field of Classification Search
CPC ......... H01L 27/14612; H01L 27/14625; H01L 27/14629; H01L 27/1463; H01L 27/14636; H01L 27/1464; H01L 27/14643; H01L 27/14685; H01L 27/14689

See application file for complete search history.

(56) References Cited

U.S. PATENT DOCUMENTS

| 7,671,435 B2 * | 3/2010 | Ahn .................. H01L 27/14634 257/444 |
| 8,946,798 B2 | 2/2015 | Horiike et al. |

(Continued)

*Primary Examiner* — Mark Tornow
*Assistant Examiner* — Priya Rampersaud
(74) *Attorney, Agent, or Firm* — Muncy, Geissler, Olds & Lowe, P.C.

(57) ABSTRACT

A photosensitive imaging apparatus and a method of forming such an apparatus are disclosed. The apparatus includes: a first semiconductor substrate, including a photosensitive semiconductor layer including an array of photodetectors; and a second semiconductor substrate, stacked with the first semiconductor substrate and including a pixel-circuitry semiconductor layer including an array of in-pixel amplifier circuitries. Each in-pixel amplifier circuitry includes at least one first pixel MOS transistor. Each first pixel MOS transistor has an active region disposed between the gate layer thereof and the first semiconductor substrate. The photosensitive imaging apparatus allows an effective reduction in noises produced during light reception of the in-pixel amplifier circuitries and an increased light utilization of the photodetectors. In addition, by separating the pixel-circuitry semiconductor layer from the photosensitive semiconductor layer, the apparatus achieves better process compatibility and is conducive to separate design and process optimization of the in-pixel amplifier circuitries and the photodetectors.

9 Claims, 9 Drawing Sheets

(56) References Cited

U.S. PATENT DOCUMENTS

| | | | | |
|---|---|---|---|---|
| 2004/0036010 | A1* | 2/2004 | Hsieh | H04N 5/378 250/208.1 |
| 2004/0041219 | A1* | 3/2004 | Chao | H01L 27/14632 257/431 |
| 2005/0040316 | A1* | 2/2005 | Holm | H01L 27/14601 250/208.1 |
| 2010/0060764 | A1* | 3/2010 | McCarten | H01L 27/14634 348/308 |
| 2010/0103298 | A1* | 4/2010 | Han | H01L 27/14632 348/294 |
| 2010/0133635 | A1* | 6/2010 | Lee | H01L 27/14623 257/433 |
| 2011/0241102 | A1* | 10/2011 | Cho | H01L 27/10888 257/329 |
| 2013/0207214 | A1* | 8/2013 | Haddad | H01L 31/0236 257/432 |

* cited by examiner

PHOTOSENSITIVE IMAGING APPARATUS AND METHOD OF FORMING SAME

CROSS-REFERENCES TO RELATED APPLICATIONS

This application claims the priority of Chinese patent application number 201510201654.5, filed on Apr. 24, 2015, the entire contents of which are incorporated herein by reference.

TECHNICAL FIELD

The present invention relates to the field of photosensitive imaging and, in particular, to a photosensitive imaging apparatus and method of forming such an apparatus.

BACKGROUND

In a conventional CMOS image sensor chip, photosensitive devices of pixels, such as photodiodes, are disposed within the same semiconductor layer together with MOS devices of in-pixel signal amplifier circuitries. This leads to a large overall area and hence low light reception efficiency of the pixels, as well as more difficulties in optimizing the photosensitive devices and the MOS devices of the signal amplifier circuitries.

Exmor sensors are developed by Sony Corporation by referencing the patent document U.S. Pat. No. 8,946,798 and employing a technique to form a three-dimensional stack of semiconductor chips through bonding the chips and interconnecting them using through silicon vias (TSV's). In the stack, the peripheral processing circuitries are partially separated from the photosensitive devices and arranged under the photosensitive devices while being connected to the photosensitive devices by the TSV's. This arrangement can effectively reduce the overall area of the chips and facilitate the design optimization and the fabrication process optimization of the MOS devices of the peripheral processing circuitries in the photosensitive devices.

However, with similarity to the conventional front- or backside-illuminated image sensors, in the Exmor sensors of the Sony Corporation, in-pixel amplifier circuitries are also disposed within the same semiconductor layer as photodiodes. Therefore, these photosensitive imaging apparatuses still suffer from the following perceived deficiencies:

1. The optical fill factor of a photodiode in a pixel is limited due to active MOS transistors disposed in the same pixel. Therefore, the footprint of the MOS transistors bottlenecks photoelectric efficiency enhancement and maintenance of the photosensitive imaging apparatus.

2. Incident and residual optical radiation entering a pixel is unfavorable for the performance of active MOS transistors and p-n junctions therein, for example, for their signal noise suppression.

3. Footprint of the photodiodes forms a limitation to layout optimization of the in-pixel amplifier circuitries and hence impedes overall performance enhancement of the photosensitive imaging apparatus.

4. The MOS devices of the in-pixel amplifier circuitries and photodiodes disposed within the same semiconductor layer restrict each other, making the design optimization and the fabrication process optimization of these different semiconductor devices difficult.

SUMMARY OF THE INVENTION

In view of the state-of-the-art situation, there is an urgent need for photosensitive imaging apparatuses with a vertical structure in which photodiodes in pixels receive and absorb light radiation at a maximum efficiency and active MOS transistors of in-pixel amplifier circuitries are disposed vertically under the photodiodes, i.e., a backside relative to the light radiation receiving side, with the shortest, material-compatible electrical connections to the photodiodes.

However, the existing photosensitive imaging apparatuses with such a vertical structure still need improvements for achieving low leakage, silicon compatibility and vertical interconnection. Among these needed improvements, those particularly important and urgent to be made are in their performance in interconnection between inputs of the photodiode and outputs of the amplifier circuitries and in light loss reduction.

It is therefore an objective of the present invention to provide a high-performance photosensitive imaging apparatus and a method of forming it.

At the first, the present invention solves the above-described problems in the CMOS image sensors by presenting a photosensitive imaging apparatus which includes:

a first semiconductor substrate, comprising a photosensitive semiconductor layer including an array of photodetectors; and a second semiconductor substrate, stacked with the first semiconductor substrate and comprising a pixel-circuitry semiconductor layer including an array of in-pixel amplifier circuitries, each of the in-pixel amplifier circuitries comprising at least one first pixel MOS transistor, wherein each of the at least one first pixel MOS transistor has an active region disposed between a gate layer thereof and the first semiconductor substrate.

Optionally, the photosensitive imaging apparatus may further include, between the first semiconductor substrate and the second semiconductor substrate, a bonding dielectric layer for bonding the first semiconductor substrate and the second semiconductor substrate together. The bonding dielectric layer may be reflective to light incident through the photosensitive semiconductor layer.

A method of forming a photosensitive imaging apparatus includes:

providing a first semiconductor substrate, the first semiconductor substrate comprising a photosensitive semiconductor layer including an array of photodetectors;

providing a second semiconductor substrate, the second semiconductor substrate comprising a pixel-circuitry semiconductor layer including an array of in-pixel amplifier circuitries, each of the in-pixel amplifier circuitries comprising at least one first pixel MOS transistor; and bonding the second semiconductor substrate to the first semiconductor substrate, wherein each of the at least one first pixel MOS transistor has an active region disposed between a gate layer thereof and the first semiconductor substrate.

Optionally, the method may further include, before bonding the second semiconductor substrate to the first semiconductor substrate, forming a first bonding dielectric sub-layer on the first semiconductor substrate and forming a second bonding dielectric sub-layer on the second semiconductor substrate, and bonding the second semiconductor substrate to the first semiconductor substrate may be accomplished by bonding the first bonding dielectric sub-layer to the second bonding dielectric sub-layer, the bonded first and second bonding dielectric sub-layers forming a bonding dielectric layer.

Compared with the prior art, the present invention offers the advantages as follows: in the photosensitive imaging apparatus according to the present invention, two substrates are innovatively bonded together and serve as basis for respectively forming a photosensitive pixel layer and an amplifier circuitry layer, so that the pixel layer and the amplifier circuitry layer are separate layers isolated from each other by a bonding dielectric layer disposed therebetween, which results in an effective reduction in noises produced during light reception of the in-pixel amplifier circuitries, as well as an increased effective area of the photodetectors and hence improved light utilization; and the separation of the pixel-circuitry semiconductor layer and the photosensitive semiconductor layer achieves better process compatibility and is conducive to separate design and process optimization of the in-pixel amplifier circuitries and the photo detectors.

In preferred embodiments, the bonding dielectric layer is reflective to light incident through the pixel layer, thereby further improving light utilization and enhancing the photoelectric properties of the photodetectors.

In other preferred embodiments, at least one contact plug is provided to effectuate interconnection of photodiodes in the pixel layer to the amplifier circuitries, making it possible to separate the amplifier circuitry layer from the pixel layer with good process compatibility.

DETAILED DESCRIPTION

The present invention will be described in greater detail in the following description which presents preferred embodiments of the invention, in conjunction with the accompanying drawings. It is to be appreciated that those of skill in the art can make changes in the invention disclosed herein while still obtaining the beneficial results thereof. Therefore, the following description shall be construed as being intended to be widely known by those skilled in the art rather than as limiting the invention. In the description of the following embodiments, depending on the used process, any pMOS device referred to is interchangeable with a corresponding nMOS device, any source referred to is interchangeable with a corresponding drain, and any p-type item referred to is interchangeable with a corresponding n-type item. Therefore, the following description is exemplary and explanatory only and is not restrictive.

Embodiment 1

Figure 1:
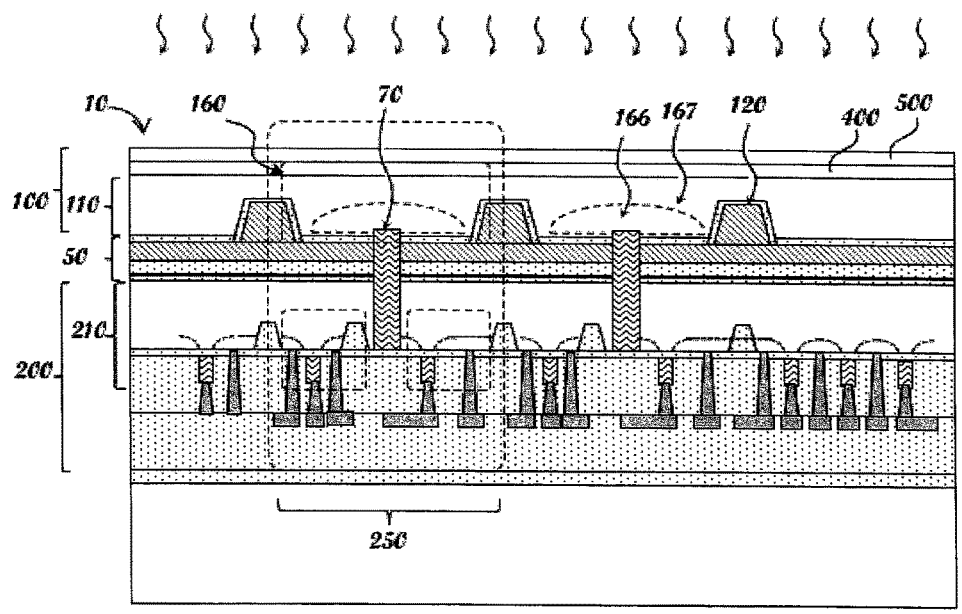
FIG. 1 is a structural schematic illustration of a photosensitive imaging apparatus in accordance with one embodiment of the present invention.

With reference to FIG. 1, the present invention provides a novel photosensitive imaging apparatus 10 including: a first semiconductor substrate 100, including a photosensitive semiconductor layer 110 comprised of an array of photodetectors 160; and a second semiconductor substrate 200, disposed in a stack with the first semiconductor substrate 100 and including a pixel-circuitry semiconductor layer 210 comprised of an array of in-pixel amplifier circuitries 250. Each in-pixel amplifier circuitry 250 includes at least one first pixel MOS transistor. Each first pixel MOS transistor has an active region located between a gate layer of the transistor and the first semiconductor substrate 100.

Because the in-pixel amplifier circuitries 250 and the photodetectors 160 are arranged in different layers, and since the active region of each first pixel MOS transistor is located between the gate layer of the transistor and the first semiconductor substrate 100, i.e., the gate is located at a backside of the pixel-circuitry semiconductor layer 210 relative to the photodetectors 160, it is possible to wire and interconnect the first pixel MOS transistors at the backside of the pixel-circuitry semiconductor layer 210 rather than in the layer where the photodetectors are located. This results in great enhancement in light utilization of the photodetectors, simplification of interconnection and reduction in parasitic effects.

Due to the fabrication method of the photosensitive imaging apparatus, the active region of each first pixel MOS transistor in the second semiconductor substrate 200 is located between the gate layer of the transistor and the first semiconductor substrate 100 that is spaced apart from the second semiconductor substrate 200. As a result, the photosensitive imaging apparatus 10 according to the present invention is distinct, in terms of spatial configuration of pixels, from the conventional MOS image sensor devices, EXMOR sensors of the Sony Corporation and those of previous disclosed techniques.

In this embodiment, between the first semiconductor substrate 100 and the second semiconductor substrate 200, there is further included a bonding dielectric layer 50 for bonding the first semiconductor substrate 100 and the second semiconductor substrate 200 together. The bonding dielectric layer 50 is reflective to light incident through the photosensitive semiconductor layer 110.

As the bonding dielectric layer 50 underlying the photodetectors 160 is able to reflect leakage light back into the photosensitive semiconductor layer 110, the light utilization is enhanced and parasitic effects that may be caused by stray light in the amplifier circuitries is avoided. The photosensitive imaging apparatus with the stacked layers may be fabricated in a process that is compatible with existing semiconductor manufacturing processes and has optimized dimensions that can facilitate its integration.

Preferably, the bonding dielectric layer 50 forms a Bragg reflector for the incident light. The bonding dielectric layer 50 may be a multilayer silicon dioxide-silicon nitride-silicon dioxide structure, which, together with the photosensitive semiconductor layer 110 and the pixel-circuitry semiconductor layer 210, produces Bragg reflection for the light incident through the photosensitive semiconductor layer 110.

In this embodiment, the bonding dielectric layer is preferably made of silicon dioxide or silicon nitride, which are semiconductor materials. Such materials are more desirable than metals due to their high temperature resistance which can ensure the bonding dielectric layer not to be damaged in the subsequent processes. In addition, this leads to the formation of a multilayer silicon-silicon dioxide-silicon nitride-silicon dioxide-silicon structure which has different refractive indices and provides Bragg reflection interfaces to residual light radiation that is incident on the bonding dielectric layer. Therefore, a further increase in light utilization of the photodetectors 160 is achieved with a simple process and simplified architecture.

Preferably, there is further included at least one contact plug 70 vertically extending through the bonding dielectric layer 50, which provides physical and electrical interconnection of outputs of the photodetectors 160 to inputs of the in-pixel amplifier circuitries 250. Such interconnection simplifies the interconnection of the three-dimensional photosensitive imaging apparatus. It enables three-dimensional interconnection and an effective reduction in parasitic effects, thereby making it possible to realize the three-dimensional photosensitive imaging apparatus. The contact plug 70 extending through the bonding dielectric layer 50 may be formed of one or more semiconductor materials. In this embodiment, the contact plug 70 is preferably made of polysilicon which allows compatibility with existing semiconductor processes and simplifies the process. Alternatively, the contact plug 70 may also be made of a solid single-element semiconductor material or an alloy. The contact plug 70 may be made of silicon, germanium, gallium, arsenic, graphene, diamond or a combination thereof. As these semiconductor materials have higher temperature resistance than metals, it can be ensured that the contact plug will not be damaged during the subsequent processes. Further, the contact plug 70 formed of a semiconductor material has a lower contact resistance and hence better compatibility with the photodetectors 160 and the MOS transistors which are also made of semiconductor materials.

The photodetectors 160 are photodiodes whose surfaces are located in the surface of the photosensitive semiconductor layer. The contact plug 70 is physically connected to p-regions or n-regions of the photodiodes, for example, n-regions 166 in this embodiment. The n-regions 166 may be formed by performing ion implantation through a contact hole for forming the contact plug 70, and p-regions 167 may be formed by doping the semiconductor substrate. The photodiodes can serve to receive light radiation and convert the light radiation to electric signals.

The photosensitive semiconductor layer 110 includes a mesh structure formed of insulating spacers 120 which electrically isolate each photodetector 160 from adjacent photodetectors 160. In this embodiment, the mesh structure has quadrilateral or hexahedral cells. The insulating spacers 120 are reflective to residual optical radiation within the photodetectors surrounded thereby, and cooperate with the bonding dielectric layer 50 to reflect lateral leakage light back to the layer for recovery. In conventional photosensitive imaging apparatuses, leakage light recovery was impossible. Therefore, by the advantageous use of the mesh structure of insulating spacers, the present invention can achieve inter-pixel insulation and light utilization enhancement, thus improving accuracy of the apparatus.

In this embodiment, the insulating spacers 120 are preferably made of silicon dioxide or silicon nitride or combination thereof. In addition, this leads to the formation of a multilayer silicon-silicon dioxide-silicon nitride-silicon dioxide-silicon structure which provides Bragg reflection for light beams entering the silicon substrate of the photosensitive semiconductor layer. Therefore, the use of the material(s) enables the insulating spacers 120 to have good performance in reflection.

In this embodiment, preferably, the photosensitive imaging apparatus 10 further includes a conductive coating layer 400 covering the photosensitive semiconductor layer 110. The conductive coating layer 400 can receive light radiation prior to the photosensitive semiconductor layer 110 and provide physical and electrical interconnection among the same terminals, for example, n-terminals, in the array of the photodetectors 160. For example, the conductive coating layer may be a metal layer. In this case, the conductive coating layer can reduce electrical resistance of the photodetectors and improve interconnection between the components.

Preferably, the photosensitive imaging apparatus 10 further includes an anti-reflective layer 500 covering the photosensitive semiconductor layer 110 for improved light utilization.

Figure 2:
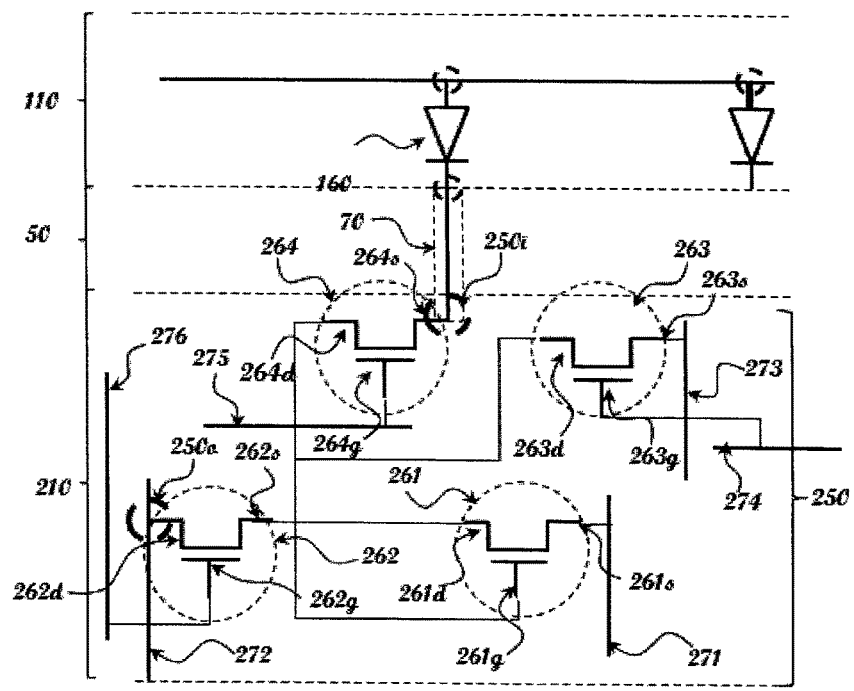
FIG. 2 is a schematic circuit diagram of a photosensitive imaging apparatus in accordance with one embodiment of the present invention.

FIG. 2 is a schematic of one of the in-pixel amplifier circuitries of FIG. 1. With reference to FIG. 2, the pixel-circuitry semiconductor layer 210 includes the silicon substrate and semiconductor materials overlying the silicon substrate. The in-pixel amplifier circuitries 250 are complementary metal-oxide-semiconductor (CMOS) circuits. Each first pixel MOS transistor acts as a charge transfer switch 264, which has a source 264s serving as an input 250i of the in-pixel amplifier circuitries 250 and electrically connected to the contact plug 70, and further has a gate 264g that is electrically connected to an interconnection 275 for charge transfer control.

Each in-pixel amplifier circuitry 250 further includes a source-follower amplifier transistor 261 having a gate 261g electrically connected to a drain 264d of the charge transfer switch 264 and a source 261s electrically connected to an interconnection 271 for a constant-voltage load. Each in-pixel amplifier circuitry 250 further includes a selection switch transistor 262 having a gate 262g electrically connected to an interconnection 276 for output selection control, a source 262s electrically connected to a drain 261d of the source-follower amplifier transistor 261, and a drain 262d that acts as an output 250o of the in-pixel amplifier circuitry 250 and is electrically connected to a column output interconnection 272. Each in-pixel amplifier circuitry 250 further includes a reset switch transistor 263 having a source 263s electrically connected to an interconnection 273 for a reset-voltage load, a gate 263g electrically connected to an interconnection 274 for reset control, and a drain 263d electrically connected to the drain 264d of the charge transfer switch 264. The gates of each of the aforementioned transistors are inverted with respect to those of the photodetectors. In this embodiment, depending on the fabrication process, either a pMOS or nMOS process may be used. In case of the nMOS process, each of the sources serves as an input, while each of the drains as an output. On the other hand, in case of the pMOS process, each of the sources serves as an output, whilst each of the drains as an input. Therefore, in this embodiment, depending on the used process, the sources may be connected in a manner that is interchangeable with that for the connection of the drains. While this embodiment is described in context of an nMOS process, the description is not provided for limitation. Circuit connection methods known to those skilled in the art are not described herein for the sake of clarity.

In other embodiments, each first pixel MOS transistor may also be implemented as a source-follower amplifier transistor having a gate electrically connected to the contact plug 70 and a source electrically connected to an interconnection for a constant-voltage load.

Embodiment 2

Figure 3:
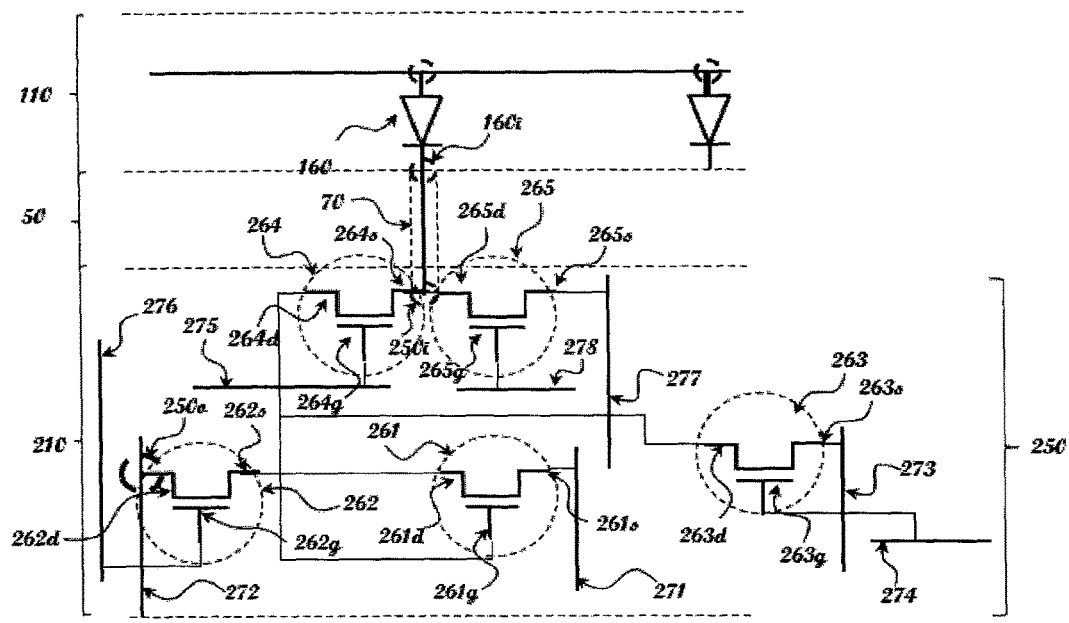
FIG. 3 is a schematic circuit diagram of a photosensitive imaging apparatus in accordance with another embodiment of the present invention.

As shown in FIG. 3, the pixel-circuitry semiconductor layer 210 is comprised of the silicon substrate and semiconductor materials overlying the silicon substrate. The in-pixel amplifier circuitries 250 are complementary metal-oxide-semiconductor (CMOS) circuits. Each first pixel MOS transistor acts as a charge transfer switch 264, the charge transfer switch 264 has a source 264s serving as an input 250i of the in-pixel amplifier circuitries 250 and electrically connected to the contact plug 70, and the charge transfer switch 264 further has a gate 264g that is electrically connected to an interconnection 275 for charge transfer control.

Each in-pixel amplifier circuitry 250 further includes a source-follower amplifier transistor 261 having a gate 261g electrically connected to a drain 264d of the charge transfer switch 264 and a source 261s electrically connected to an interconnection 271 for a constant-voltage load. Each in-pixel amplifier circuitry 250 further includes a selection switch transistor 262 having a gate 262g electrically connected to an interconnection 276 for output selection control, a source 262s electrically connected to a drain 261d of the source-follower amplifier transistor 261, and a drain 262d that acts as an output 250o of the in-pixel amplifier circuitry 250 and is electrically connected to a column output interconnection 272. Each in-pixel amplifier circuitry 250 further includes a reset switch transistor 263 having a source 263s electrically connected to an interconnection 273 for a reset-voltage load, a gate 263g electrically connected to an interconnection 274 for reset control, and a drain 263d electrically connected to the drain 264d of the charge transfer switch 264. A pixel switch transistor 265 has one of its source 265s and drain 265d electrically connected to the contact plug 70 and a gate 265g electrically connected to an interconnection 278 for pixel control. The other one of the source 265s and drain 265d is in connection with an interconnection 277. The gates of each of the aforementioned transistors are inverted with respect to those of the photodetectors.

In conventional photosensitive imaging apparatuses, since the photodetectors are disposed in the same layer with the in-pixel amplifier circuitries, in order to improve light utilization of the photodetectors, performance of the amplifier circuitries must be compromised. To this end, the highest priority is given to a minimum area, and a 3T or 4T process is therefore usually used, which, however, limits the optical imaging performance. According to the present invention, the fabrication process is improved to significantly optimize the interconnection, which entails such a revolutionary change in the configuration of the apparatus that both the photodetectors and the in-pixel amplifier circuitries, and even the processing circuitries, can function at their best performance without mutual influence.

In this embodiment, the pixel switch transistor can release an optical signal that has not been extracted by a photodiode during a first sampling operation, so that the signal will not be present during a second sampling operation. Therefore, the results of the second sample operation will not be affected and the accuracy can be improved.

Photosensitive imaging apparatuses and methods of forming them according to the present invention will be described below in greater detail with reference to some specific embodiments of the methods.

Embodiment 3

A method of forming a photosensitive imaging apparatus according to the present invention includes the steps discussed follows.

In step S10, a first semiconductor substrate 15 is provided.

Figure 4:
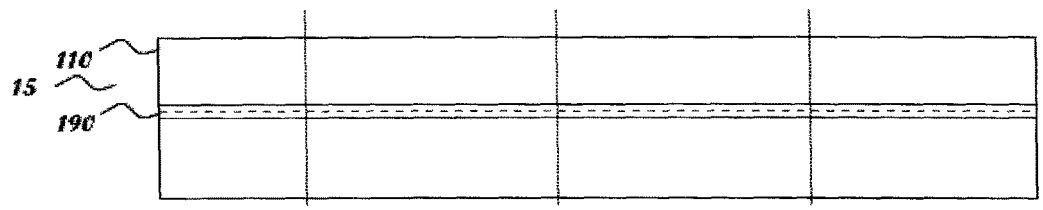
FIGS. 4 to 16 are schematics illustrating a method of forming a photosensitive imaging apparatus in accordance with Embodiment 1 of the present invention.

Specifically, as shown in FIG. 4, the first semiconductor substrate 15 is preferably a p-doped monocrystalline silicon substrate. In this embodiment, preferably, the first semiconductor substrate 15 includes a photosensitive semiconductor layer 110, and a first pre-buried splitting activation layer 190 is formed under the surface of the first semiconductor substrate 15, i.e., under the photosensitive semiconductor layer 110. In this embodiment, this may be accomplished by implanting hydrogen ions in the first semiconductor substrate 15, followed by high-temperature annealing. The ions may be implanted to a depth of between 0.02 μm and 0.2 μm such as, for example, 0.05 μm, 0.1 μm, or 0.15 μm. The used annealing chamber may be filled with hydrogen or a mixed gas of nitrogen and hydrogen, or not filled with any gas. The presence of the first pre-buried splitting activation layer 190 can enable subsequent thinning of the first semiconductor substrate 15 to be conducted in a simple manner causing less damage. Of course, in other embodiments, the first pre-buried splitting activation layer 190 may not be formed, and the thinning may be accomplished by a conventional method. In addition, in other embodiments, the first semiconductor substrate 15 may also be n-doped monocrystalline silicon.

Figure 5:
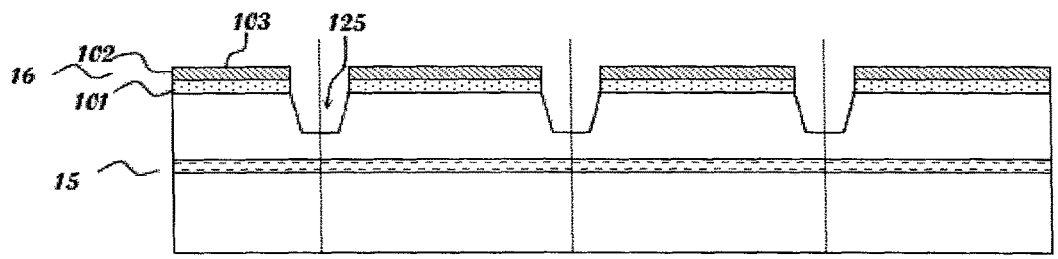

Referring now to FIG. 5, a first bonding dielectric sub-layer 16 is formed over the surface of the first semiconductor substrate 15. In this embodiment, the first bonding dielectric sub-layer 16 is a composite layer of silicon dioxide and silicon nitride. Specifically, a first silicon dioxide layer 101 may be grown into a thickness of 5-200 nm preferably by thermal oxidation. In this embodiment, the thermal oxidation may be accomplished by a wet or dry method performed at a temperature of 800-1200° C. such as, for example, 900° C., 1000° C. or 1100° C. Thereafter, a first silicon nitride layer 102 may be formed into a thickness of 5-500 nm such as, for example, 50 nm, 100 nm, 200 nm or 300 nm, on the surface of the first silicon dioxide layer 101. Specifically, the first silicon nitride layer 102 may be formed by a chemical vapor deposition (CVD) process conducted at a temperature of 400-1000° C. such as, for example, 500° C., 600° C., 700° C. or 800° C.

In this embodiment, as shown in FIG. 5, step S15 is preferably included, in which a first hard mask layer 103 is formed by performing photolithography and etching processes on the first silicon nitride layer 102 and the first silicon dioxide layer 101. The hard mask layer 103 may be a mesh structure which has quadrilateral or hexahedral cells. In this embodiment, the mesh structure is a honeycomb-like structure with hexahedral cells. After that, an etching process may be carried out on the first semiconductor substrate 15, with the honeycomb-like structure serving as a mask, such as to form trenches 125 corresponding in shape to the mesh cells. In this embodiment, each trench 125 may have a depth of 0.2-5 μm such as, for example, 1 μm, 2 μm, 3 μm or 4 μm in the first semiconductor substrate 15 and a width of 5-500 nm such as, for example, 100 nm, 200 nm, 300 nm, or 400 nm within the honeycomb-like structure. After the trenches 125 have been formed by etching, there is preferably further included an annealing process performed at a temperature of 300-1200° C. such as, for example, 400° C., 700° C. or 900° C., for repairing etching damage on the etched surfaces and deep trenches.

Figure 6:
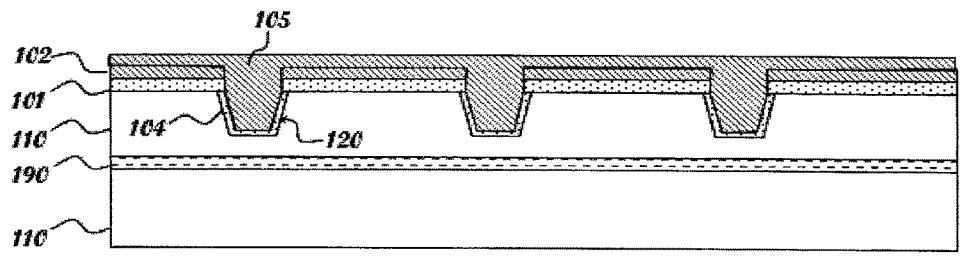

As shown in FIG. 6, silicon dioxide spacers 104 may be then formed over side walls of the trenches 125, followed by filling of the trenches 125. Preferably, the silicon dioxide spacers 104 are formed by a thermal oxidation process. In this embodiment, the process may be performed at a temperature of 800-1200° C. such as, for example, 900° C., 1000° C. or 1100° C., and the resulting silicon dioxide spacers 104 may have a thickness of 5-200 nm such as, for example, 50 nm, 100 nm, or 150 nm. Subsequently, a silicon nitride filling layer 105 may be formed over the silicon dioxide spacers 104 and the hard mask layer 103. Preferably, the silicon nitride filling layer 105 is formed using a high-temperature CVD technique, such that portions of the silicon nitride filling layer 105 filled in the trenches 125 form the mesh structure of insulating spacers 120, with each cell isolated by the insulating spacers 120 corresponding to a pixel and the insulating spacers 120 dividing the photosensitive semiconductor layer 110 into an array of photodetectors.

Figure 7:
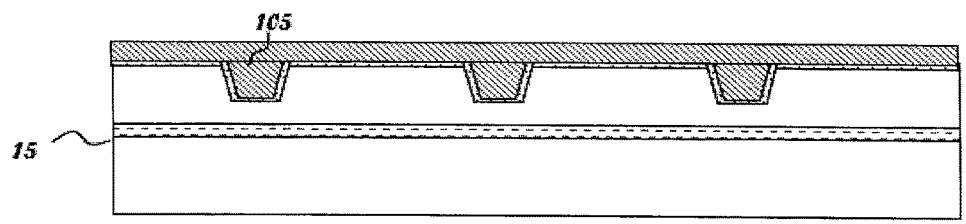
Figure 8:
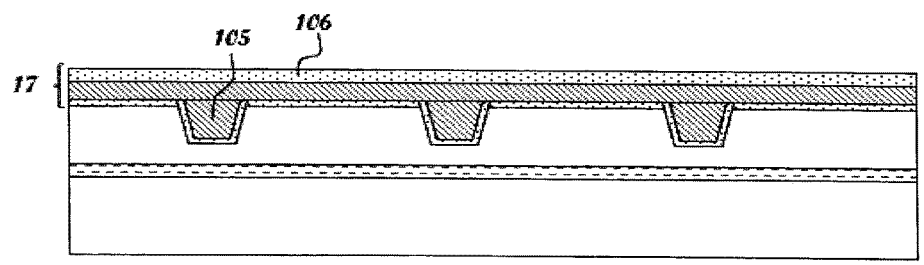

Subsequently, as shown in FIG. 7, the silicon nitride layer 105 overlying the first semiconductor substrate 15 may be planarized by chemical mechanical polishing (CMP). As shown in FIG. 8, a second silicon dioxide layer 106 may be formed over the remaining silicon nitride filling layer 105. In this embodiment, the first silicon dioxide layer 101, the remaining silicon nitride filling layer 105 and the second silicon dioxide layer 106 together constitute the first bonding dielectric sub-layer 17.

In step S20, a second semiconductor substrate 20 is provided.

Figure 9:
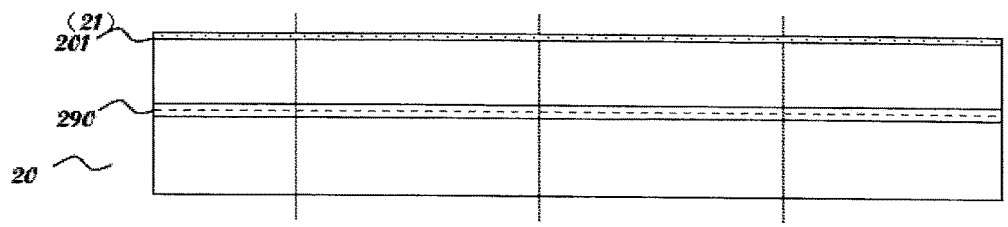

Specifically, as shown in FIG. 9, the second semiconductor substrate 20 is preferred to be a p-doped monocrystalline silicon substrate. In this embodiment, preferably, a second pre-buried splitting activation layer 290 is formed under the surface of the second semiconductor substrate 20. In this embodiment, this may be accomplished by implanting hydrogen ions into the second semiconductor substrate 20, followed by high-temperature annealing. The ions may be implanted to a depth of between 0.02 μm and 0.2 μm such as, for example, 0.05 μm, 0.1 μm, or 0.15 μm. The used annealing chamber may be filled with hydrogen or a mixed gas of nitrogen and hydrogen, or not filled with any gas. The presence of the second pre-buried splitting activation layer 290 can enable subsequent thinning of the second semiconductor substrate to be conducted in a simple manner causing less damage. Of course, in other embodiments, the second pre-buried splitting activation layer may not be formed, and the thinning may be accomplished using a conventional method. In addition, in other embodiments, the second semiconductor substrate may also be n-doped monocrystalline silicon.

Referring to FIG. 9, a second bonding dielectric sub-layer 21 may be formed on the surface of the second semiconductor substrate 20. In this embodiment, the second bonding dielectric sub-layer 21 may be silicon dioxide. Specifically, a bonding silicon dioxide layer 201 may be grown preferably by thermal oxidation. The thermal oxidation may be accomplished by a wet or dry method performed at a temperature of 800-1200° C. such as, for example, 900° C., 1000° C. or 1100° C., and the resulting bonding silicon dioxide layer may have a thickness of 5-200 nm such as, for example, 50 nm, 100 nm, or 150 nm.

In step S30, the first semiconductor substrate 15 is bonded to the second semiconductor substrate 20.

Figure 10:
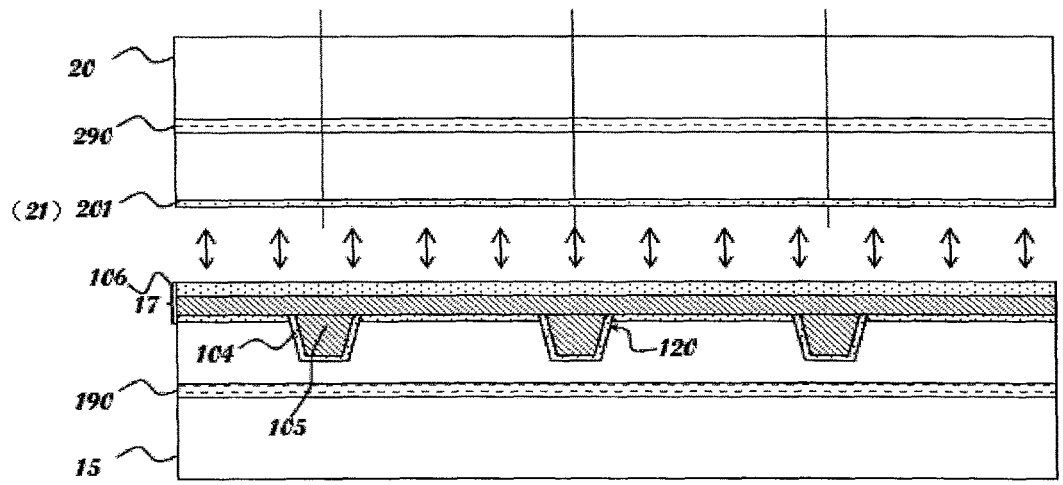

Specifically, with reference to FIG. 10, the second semiconductor substrate 20 may be bonded to the second silicon dioxide layer 106 overlying the first semiconductor substrate 15 via the bonding silicon dioxide layer 201. After the bonding, the bonding silicon dioxide layer 201, together with the second silicon dioxide layer 106 and a portion of the silicon nitride filling layer 105 underlying the second silicon dioxide layer 106, forms a bonding dielectric layer 50 for helping the first semiconductor substrate and second semiconductor substrate provide Bragg reflection for visible external light incident onto a lower side of the first semiconductor substrate. Meanwhile, the insulating spacers 120 of the honeycomb-like mesh may also constitute part of the bonding dielectric layer 50 and hence assist the first semiconductor substrate and second semiconductor substrate in providing the Bragg reflection which enables residual light to be reflected back.

In this embodiment, the bonding may be accomplished by bonding the second bonding dielectric sub-layer 21 overlying the second semiconductor substrate 20, i.e., the surface of the bonding silicon dioxide layer 201, to the first bonding dielectric sub-layer 17 overlying the first semiconductor substrate 15, i.e., the surface of the second silicon dioxide layer 106 under a high pressure at a temperature of 200-400° C. such as, for example, 250° C., 300° C. or 350° C. As a result, as shown in the FIG. 11, the bonding dielectric layer 50 is formed. An annealing process may then be performed at a temperature of 350-1150° C. such as, for example, 550° C., 750° C. or 950° C., to, for example, eliminate physical stress on the adhering surfaces.

Figure 11:
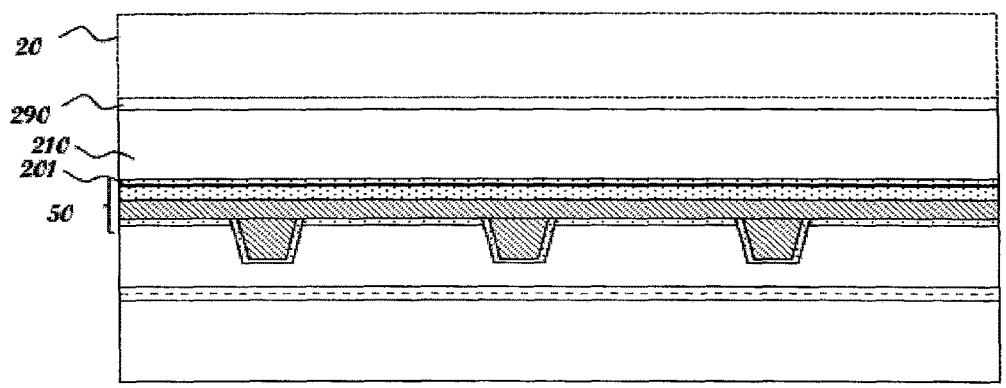

In this embodiment, as shown in FIG. 11, step S31 is preferably further included, in which thinning the second semiconductor substrate 20 from its backside to form a pixel-circuitry semiconductor layer 210. This step is optional but able to facilitate a subsequent etching process for forming a contact plug with higher accuracy and to allow the photosensitive imaging apparatus being fabricated have a smaller thickness.

Specifically, in the step S31, the thinning of the second semiconductor substrate 20 from its backside may be accomplished by splitting the second pre-buried splitting activation layer 290 with the first semiconductor substrate 15 serving as a support. The second semiconductor substrate 20 can serve as a pixel-circuitry semiconductor layer for subsequent formation of pixel circuitries, and may have a thickness of from 50 nm to 5 μm such as, for example, 200 nm or 800 nm. Alternatively, the second semiconductor substrate 20 may also be thinned by another method, or not be thinned.

Figure 12:
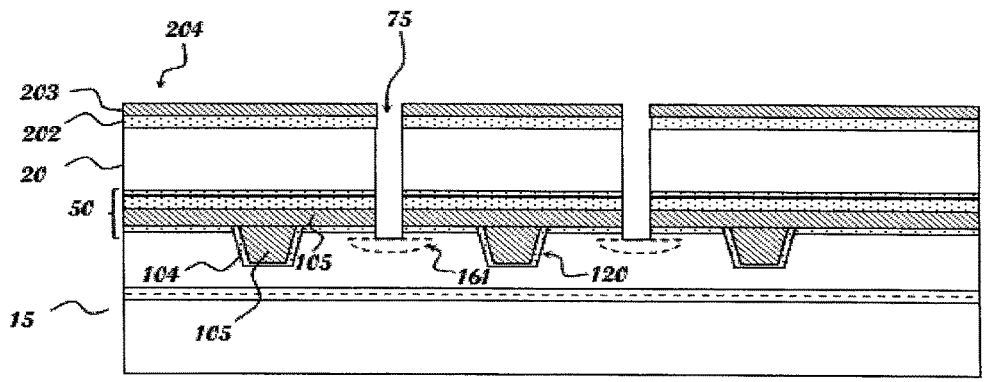

In this embodiment, as shown in FIG. 12, step S32 is preferably further included, in which a contact hole 75 that exposes the first semiconductor substrate 15 is formed in the thinned second semiconductor substrate 20 using an etching process.

Specifically, a first sacrificial silicon dioxide layer 202 and a first sacrificial silicon nitride layer 203 may be formed over the second semiconductor substrate 20 and then shaped into a hard mask layer 204 by photolithography and etching processes. Another etching process may then be carried out to form the contact hole 75 which vertically extends through the second semiconductor substrate 20, the bonding dielectric layer 50 and a portion of the first semiconductor substrate 15 such that the first semiconductor substrate 15 is opened. An annealing process may then be carried out to repair damage present on the side walls of the contact hole 75.

Figure 13:
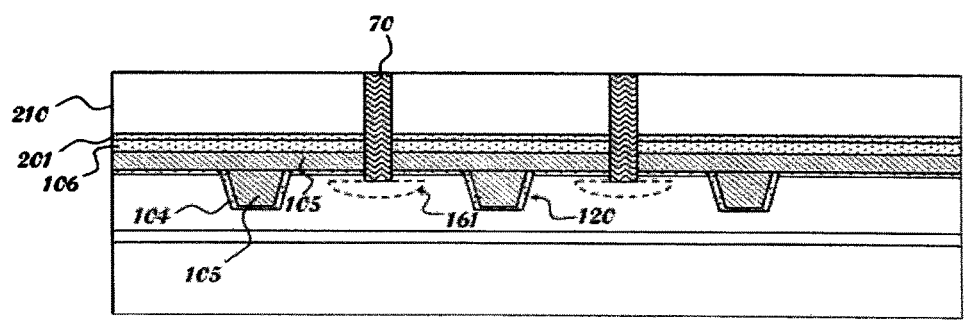

Preferably, with reference to FIGS. 12 and 13, step S33 is further included, in which the first semiconductor substrate 15 is doped through the contact hole 75, preferably by ion implantation, such that a p-n junction is formed in the first semiconductor substrate 15. As shown in FIG. 13, an n-region 161, together with the doped first semiconductor substrate 15, forms the p-n junction which is subsequently further formed into a photosensitive photodiode. Since the first semiconductor substrate is a p-substrate in this embodiment, n-type ions are implanted in this step S33. The ion implantation step is optional, and it is also possible to form the p-n junction by ion implantation, followed by annealing, in another step. In this embodiment, performing ion implantation by virtue of the contact hole 75 in this step can save process steps and result in a higher accuracy in ion implantation.

Subsequently, with reference to FIG. 13, the contact hole 75 is filled with silicon and thus forms a contact plug 70. Preferably, n-type polysilicon is filled by low-pressure CVD at a temperature of 550-700° C., for example, 600° C. or 650° C., followed by an annealing process. After that, the hard mask layer 204 may be removed, followed by planarization of the contact plug 70 through etching away an upper portion thereof. Alternatively, the hard mask layer 204 may also be removed in a subsequent step for forming a shallow trench isolation (STI) structure.

Figure 14:
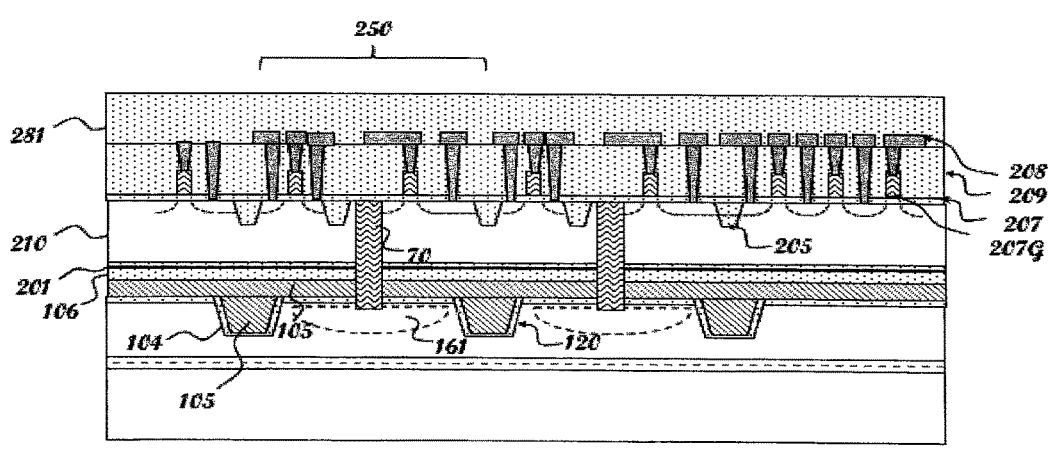

Thereafter, with reference to FIG. 14, a transistor trench isolation region 205 may be formed in the pixel-circuitry semiconductor layer 210. Specifically, this can be accomplished by using the hard mask layer 204 that has served as an etching mask for the formation of the contact hole 75 and the steps of the conventional method for forming a CMOS STI structure. A detailed description of this is not necessary and is therefore omitted here.

Subsequently, the first sacrificial silicon dioxide layer 202 and first sacrificial silicon nitride layer 203 may be removed using silicon dioxide and silicon nitride removal methods in conventional CMOS processes.

In step S40, an array of in-pixel amplifier circuitries 250 is formed on the second semiconductor substrate 20 such that inputs of the in-pixel amplifier circuitries are physically and electrically connected to one end of the contact plug 70, and the other end of the contact plug 70 is connected to the p-n junctions in the first semiconductor substrate 15.

Specifically, with continuing reference to FIG. 14, the in-pixel amplifier circuitries 250 may be formed on the second semiconductor substrate 20 using a conventional method for making a CMOS device. For example, in this example, a gate oxide 207 may be grown on surface of the second semiconductor substrate 20, preferably by thermal oxidation. A plurality of gates 207g may be formed on the gate oxide 207, followed by the formation of a source and a drain on both sides of each gate 207g. An interconnection layer 208 for physical interconnection and an intermediate dielectric layer 209 may be then formed over the gates 207g, sources and drains. The interconnection layer 208 of the in-pixel amplifier circuitries 250 may be formed using a conventional CMOS semiconductor process. In this embodiment, each pixel amplifier circuitry 250 corresponds to a pixel and includes 4 MOS transistors, including a charge transfer switch 264, a source-follower amplifier transistor 261, a selection switch transistor 262 and a reset switch transistor 263. Reference may be made to Embodiment 1 for details of their interconnection, and a detailed description of it is therefore not necessary and omitted here.

The arrangement of the amplifier circuitry discussed above is optional, and in other embodiments, the circuitry may not include the reset switch transistor 263, or only include the source-follower amplifier transistor. In the case of only including the source-follower amplifier transistor, the gate of the source-follower amplifier transistor may be electrically connected to the contact plug 70, with its source electrically connected to an interconnection 271 for a constant-voltage load.

In a preferred embodiment, with reference to FIG. 3, the circuitry further includes a pixel switch transistor 265. Reference may be made to Embodiment 2 for details of its interconnection, and a detailed description of it is therefore not necessary and omitted here.

Thereafter, with reference to FIG. 14, a bonding passivation dielectric layer 281 is deposited and planarized such that it covers the interconnection layers 208 of all the pixel amplifier circuitries 250. Preferably, this is accomplished by chemical vapor deposition of silicon dioxide or another compound, and the resulting passivation dielectric layer 281 has a thickness of 0.1-2 μm, for example, 0.5 μm, 1 μm, or 1.5 μm.

Preferably, in this embodiment, step S60 is further included, in which the first semiconductor substrate 15 is thinned, thereby forming the photosensitive semiconductor layer 110.

Figure 15:
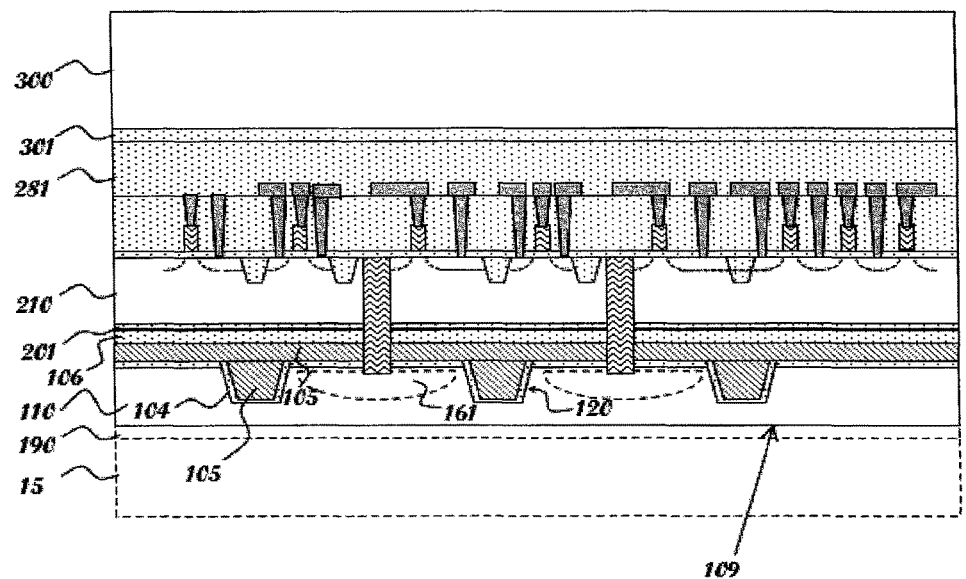

In this embodiment, with reference to FIG. 15, a third substrate 300 is preferably provided, on which a third bonding dielectric sub-layer 301 is formed. The third bonding dielectric sub-layer 301 may be implemented as a silicon dioxide layer. The third bonding dielectric sub-layer 301 on the third substrate 300 is then bonded to the passivation dielectric layer 281 on the second substrate 20. This may be accomplished by adhesion of melted silicon dioxide at a high temperature under a high pressure and an annealing process for eliminating stress on the adhering surfaces. Subsequently, the first semiconductor substrate 15 is thinned from its backside, for example, to a thickness of 10 μm in the case of visible light, so as to form the photosensitive semiconductor layer 110. Specifically, the thinning may be accomplished by splitting the first pre-buried splitting activation layer 190 to form a photosensitive semiconductor layer surface 109, with the third substrate 300 serving as a support. Of course, in other embodiments, the first semiconductor substrate may also be thinned using another method in which the third substrate is not used, for example, directly polishing the first semiconductor substrate.

Figure 16:
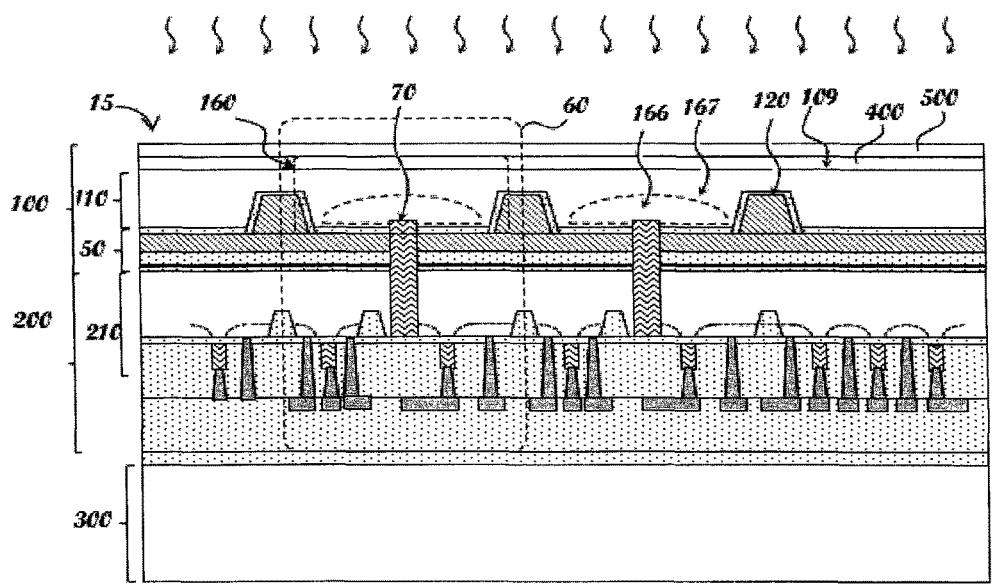

With reference to FIG. 16, in this embodiment, step S70 is preferably further included, in which an array of photodetectors 160 is formed based on the photosensitive semiconductor layer 110.

Image sensors may be formed on the surface of the photosensitive semiconductor layer 110, and a conventional backside approach may be used to form CMOS image sensors for receiving optical radiation from its backside.

Specific parameters of the aforementioned formation are as follows:

Generally, each pixel may have a planar size of 0.5-5 μm such as, for example, 2 μm, 3 μm, or 4 μm, or alternatively of up to 1100 μm in order to meet the requirements of the application of the photosensitive imaging apparatus in environments with lower illumination. The photosensitive semiconductor layer 110 may have a thickness of 0.5-6 μm such as, for example, 2 μm or 4 μm, in order to allow the absorption of most of the incident visible light.

In the above-described step, in order to form the photodiode, the first semiconductor substrate 15 may alternatively not be n-doped, and instead a portion of the first semiconductor substrate 15 in contact with the contact plug 70 may be doped from a top side of the first semiconductor substrate 15 to form p-n junctions. Following this, a conductive coating layer 400 of a thickness of 10-100 nm such as, for example, 30 nm, 60 nm or 80 nm, may be formed by, for example, low-pressure physical or chemical vapor deposition of silicon, a silicon-germanium compound, or germanium.

Subsequently, an anti-reflective layer 500 may be formed over the conductive coating layer 400. In general, the anti-reflective layer 500 may be a thin dielectric film with a thickness of 10-500 nm such as, for example, 100 nm or 300 nm.

In this case, the photosensitive semiconductor layer 110, together with the conductive coating layer 400 and the anti-reflective layer 500, above the photosensitive semiconductor layer 110, may constitute the first semiconductor substrate 100. The pixel-circuitry semiconductor layer 210, the array of the in-pixel amplifier circuitries formed based on the pixel-circuitry semiconductor layer, and the interconnection layer thereon may together constitute the second semiconductor substrate 200.

Embodiment 4

Reference may be made to corresponding portions of Embodiment 3 for details of portions of this embodiment that are the same as those of Embodiment 3, and a detailed description of such portions of this embodiment is therefore unnecessary and omitted here. This embodiment differs from Embodiment 3 mainly in what is described below.

Prior to the bonding of the second semiconductor substrate to the first semiconductor substrate 15, the formation of a first contact plug is included. After the bonding of the second semiconductor substrate and prior to the formation of the in-pixel amplifier circuitries 250, a second contact plug is further formed which is vertically connected to the first contact plug, thus forming an in-pixel contact plug 70 with its one end in connection with the p-n junctions in the first semiconductor substrate and the other end in connection with the MOS transistors of the in-pixel amplifier circuitries 250.

Specially, in step S10: a first semiconductor substrate 15 is provided.

This step is similar to that of Embodiment 1, except that, in this embodiment, step S10 further includes step S11 in which a first contact hole section which exposes the first semiconductor substrate is formed using an etching process.

Figure 17:
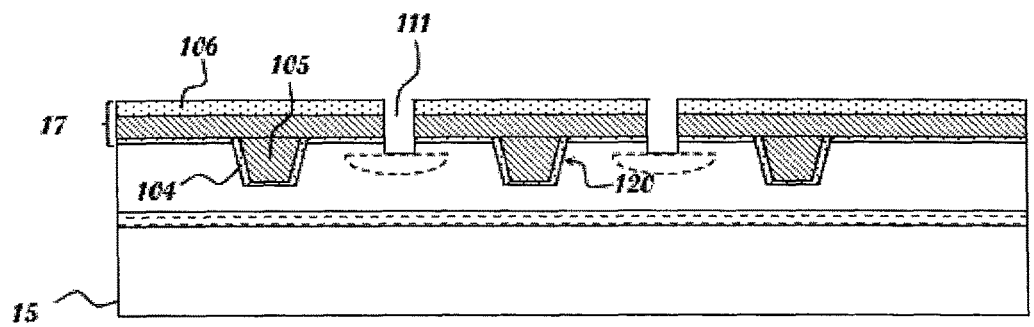
FIGS. 17 to 19 are schematics illustrating a method of forming a photosensitive imaging apparatus in accordance with Embodiment 2 of the present invention.

With reference to FIG. 17, this may specifically include: forming a hard mask on the surface of the first bonding dielectric sub-layer 17, i.e., on the surface of the second silicon dioxide layer 106; forming the first contact hole section 111 using the etching process such that the first contact hole section 111 vertically extends through the entire of the first bonding dielectric sub-layer 17 and a portion of the first semiconductor substrate 15, thereby opening the first semiconductor substrate 15; and performing an annealing process.

Figure 18:
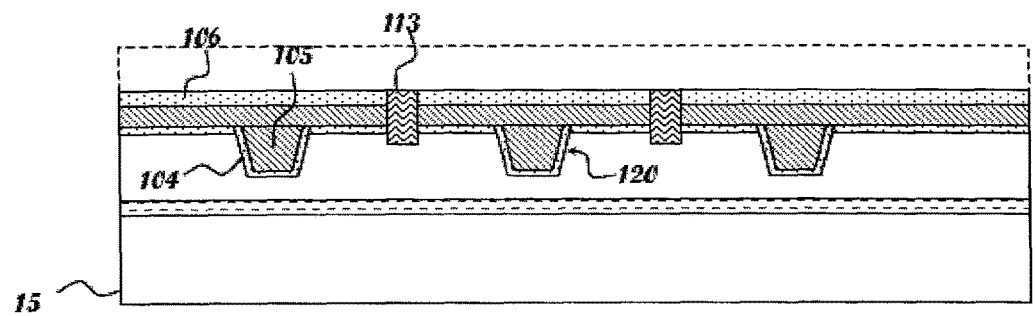

Preferably, with reference to FIG. 17, step S12 is further included, in which the first semiconductor substrate 15 is doped through the contact hole section 111, preferably by ion implantation, such that p-n junctions, which are subsequently processed into photosensitive photodiodes, are formed in the first semiconductor substrate 15. Since the first semiconductor substrate is a p-substrate in this embodiment, n-type ions are implanted in this step. The ion implantation step is optional, and it is also possible to form the p-n junctions by ion implantation in another step, followed by annealing. Subsequently, referring to FIG. 18, silicon may be filled into the first contact hole section 111, thereby forming a first contact section 113. Preferably, this is accomplished by low-pressure CVD of n-polysilicon at a temperature of 550-700° C. such as, for example, 600° C. or 650° C., followed by an annealing process.

In step S20, a second semiconductor substrate 200 is provided.

As this step is the same as that of Embodiment 1, a detailed description of it is unnecessary and omitted here.

In step S30, the first semiconductor substrate 15 is boned to the second semiconductor substrate 20.

This step is similar to that of Embodiment 1, except that, in this embodiment, step S30 does not include steps S31, S32 and S33.

In step S40, an array of in-pixel amplifier circuitries 250 is formed based on the second semiconductor substrate 20 such that inputs of the in-pixel amplifier circuitries are physically and electrically connected to one end of the contact plug 70, and the other end of the contact plug 70 is connected to the first semiconductor substrate 15.

Figure 19:
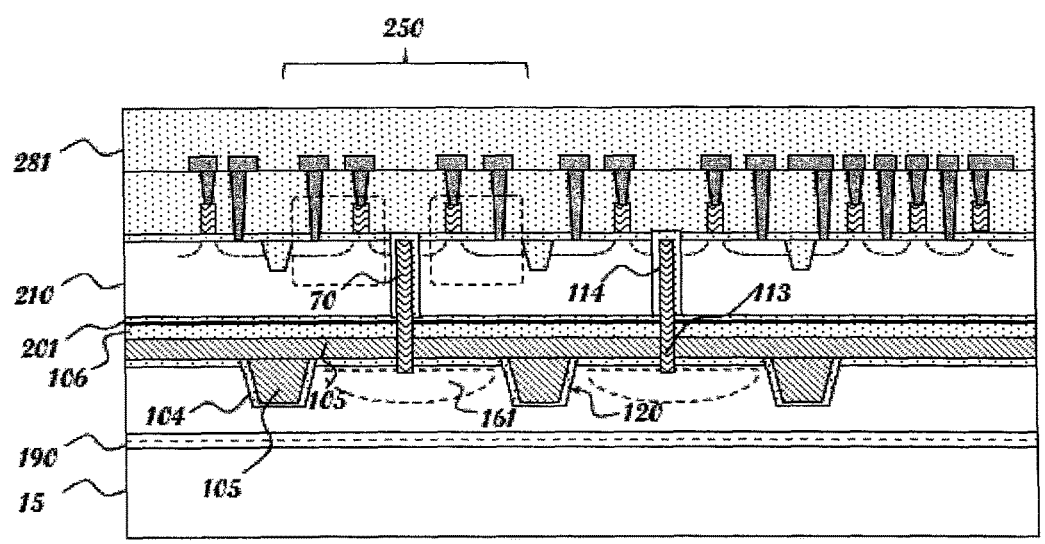
Figure 20:
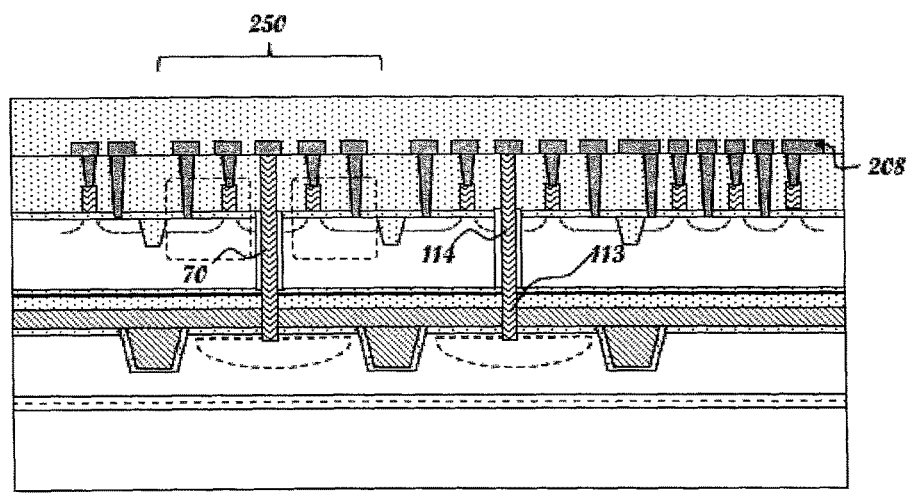
FIG. 20 is a schematic illustrating a method of forming a photosensitive imaging apparatus in accordance with one embodiment of the present invention.

With reference to FIG. 19, this step is similar to that of Embodiment 1, except that, in this embodiment, step S40 further includes step S41 in which the second semiconductor substrate is so etched that a second contact section 114 is formed in a location corresponding to that of the first contact section 113, and the second contact section 114 is filled with the same material as filled in the first contact section 113, for example, polysilicon, thereby forming a second contact section 114, after the formation of the MOS transistors of the in-pixel amplifier circuitries 250 and prior to the formation of the interconnection layer 208. In other embodiments, as shown in FIG. 20, it is also acceptable to form, after the formation of the in-pixel amplifier circuitries 250, the second contact section 114 using an etching process, simultaneously with the formation of the interconnection layer 208 overlying the in-pixel amplifier circuitries, and fill it to form the second contact section. The first contact section 113 and the second contact section 114 make up the in-pixel contact plug 70 which extends through the in-pixel amplifier circuitries 250 and is connected to the interconnection layer 208.

Embodiment 5

Reference may be made to corresponding portions of Embodiment 3 for details of portions of this embodiment that are the same as those of Embodiment 3, and a detailed description of such portions of this embodiment is therefore unnecessary and omitted here. This embodiment differs from Embodiment 3 mainly in what is described below.

After the trenches 125 corresponding to the mesh cells have been filled, the silicon nitride filling layer 105 over the first semiconductor substrate 15 is stripped away, and the first silicon dioxide layer 101 over the first semiconductor substrate remains and serves as the first bonding dielectric sub-layer. After the second semiconductor substrate 20 has been provided, over the surface of the second semiconductor substrate 20, a second bonding dielectric sub-layer is formed, which is a multilayer silicon dioxide-silicon nitride-silicon dioxide structure consisting of the bonding silicon dioxide layer 201, a bonding silicon nitride layer 211 on the bonding silicon dioxide layer 201, and a silicon dioxide layer 221 on the bonding silicon nitride layer 211. A high-temperature bonding process is performed to bond the silicon dioxide layer on the surface of the second semiconductor substrate 100, the silicon dioxide layer on the first semiconductor substrate and the silicon nitride within the trenches on the first semiconductor substrate together.

Specially, in step S10: a first semiconductor substrate 15 is provided.

Figure 21:
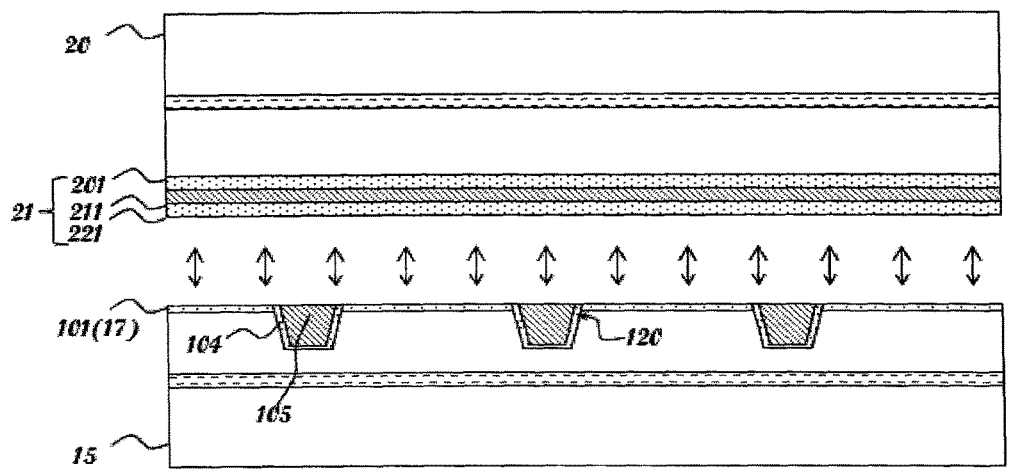
FIG. 21 is a schematic illustrating a method of forming a photosensitive imaging apparatus in accordance with Embodiment 3 of the present invention.

This step is similar to that of Embodiment 1, except that, in this embodiment, step S10 further includes step S16 in which the silicon nitride filling layer 105 and part of the silicon dioxide layer 101, over the first semiconductor substrate, are removed, as shown in FIG. 21.

In step S20, a second semiconductor substrate 20 is provided.

This step is similar to that of Embodiment 1, except that, in this embodiment, step S20 further includes step S21 in which, over the surface of the second semiconductor substrate 20, a second bonding dielectric sub-layer 21 is formed, which is a multilayer silicon dioxide-silicon nitride-silicon dioxide structure consisting of the bonding silicon dioxide layer 201, a bonding silicon nitride layer 211 on the bonding silicon dioxide layer 201, and a silicon dioxide layer 221 on the bonding silicon nitride layer 211.

In step S30, the first semiconductor substrate 15 is boned to the second semiconductor substrate 20.

This step is similar to that of Embodiment 1, except that, in this embodiment, a high-temperature bonding process is performed to bond the first bonding dielectric sub-layer 17 and second bonding dielectric sub-layer 21 together, i.e., bonding together the silicon dioxide layer 221 on the surface of the second semiconductor substrate 20, the silicon dioxide layer 101 on the first semiconductor substrate 15 and the silicon nitride 105 within the trenches on the first semiconductor substrate 15.

Embodiment 6

Reference may be made to corresponding portions of Embodiment 3 for details of portions of this embodiment that are the same as those of Embodiment 3, and a detailed description of such portions of this embodiment is therefore unnecessary and omitted here. This embodiment differs from Embodiment 3 mainly in what is described below.

After the second semiconductor substrate 20 has been bonded to the first semiconductor substrate 15, there is further included:

the formation of a contact plug 70 which extends through the bonding dielectric layer 50 and the second semiconductor substrate 100. The step of forming the mesh structure of insulating spacers is carried out after the bonding of the second semiconductor substrate 20 to the first semiconductor substrate 15. The mesh structure resembles a honeycomb.

Specially, in step S10: a first semiconductor substrate 15 is provided.

This step is similar to that of Embodiment 1, except that, in this embodiment, step S10 does not include steps S15.

In step S20, a second semiconductor substrate 20 is provided.

As this step is the same as that of Embodiment 1, a detailed description of it is unnecessary and omitted here.

In step S30, the first semiconductor substrate 15 is bonded to the second semiconductor substrate 20.

Figure 22:
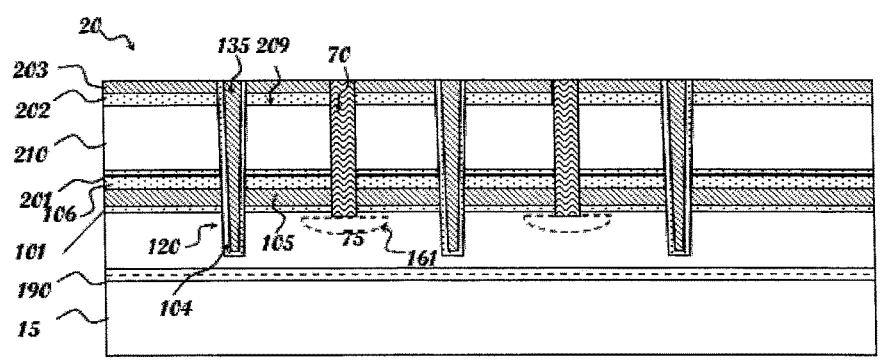
FIG. 22 is a schematic illustrating a method of forming a photosensitive imaging apparatus in accordance with Embodiment 4 of the present invention.

This step is similar to that of Embodiment 1, except that, in this embodiment, after step S33 and prior to the removal of the hard mask layer 204, there is further included step S35 in which, as shown in FIG. 22, a hard mask in the shape of a honeycomb is formed by performing photolithography and etching processes on the first sacrificial silicon nitride layer 203 and the first sacrificial silicon dioxide layer 202. An etching process is then carried out on the pixel-circuitry semiconductor layer 210 of the second semiconductor substrate 20, the bonding silicon dioxide layer 201, the second silicon dioxide layer 106, the silicon nitride filling layer 105, the first silicon dioxide layer 101 and the first semiconductor substrate 15, with the honeycomb-like structure serving as a mask, such as to form trenches 125 corresponding in shape to the mesh cells. In this embodiment, each trench 125 may have a depth of 0.2-5 µm such as, for example, 2 µm, 3 µm or 4 µm in the first semiconductor substrate 15 and a planar size (i.e. width) of 5-500 nm such as, for example, 100 nm or 300 nm within the honeycomb-like structure. After the trenches 125 have been formed by etching, there is further preferably included an annealing process performed at a temperature of 300-1200° C. such as, for example, 500° C., 700° C. or 900° C., for repairing etching damage on the etched surfaces and deep trenches.

Thereafter, silicon dioxide spacers 104 may be formed over side walls of the trenches 125, followed by filling of the trenches 125. Preferably, the spacers are formed by a thermal oxidation process. In this embodiment, the process may be performed at a temperature of 800-1200° C. such as, for example, 900° C., 1000° C. or 1100° C., and the resulting spacers may have a thickness of 5-200 nm such as, for example, 100 nm or 150 nm. Subsequently, a silicon nitride filling layer 135 may be formed over the silicon dioxide spacers 104 and the first sacrificial silicon nitride layer 203. Preferably, the silicon nitride layer 135 is formed using a high-temperature CVD technique, such that portions of the silicon nitride layer 135 filled in the trenches 125 form the mesh of insulating spacers 120, with each cell isolated by the insulating spacers 120 corresponding to a pixel.

Obviously, those skilled in the art can make various modifications and alterations without departing from the spirit and scope of the invention. It is therefore intended that the invention be construed as including all such modifications and alterations insofar as they fall within the scope of the appended claims or equivalents thereof.

What is claimed is:

1. A photosensitive imaging apparatus, comprising:
a first semiconductor substrate, comprising a photosensitive semiconductor layer including an array of photodetectors;
a second semiconductor substrate, stacked with the first semiconductor substrate and comprising a pixel-circuitry semiconductor layer including an array of in-pixel amplifier circuitries, each of the in-pixel amplifier circuitries comprising at least one first pixel MOS transistor;
a bonding dielectric layer between the first semiconductor substrate and the second semiconductor substrate for bonding the first semiconductor substrate and the second semiconductor substrate together; and
at least one contact plug, extending vertically through the bonding dielectric layer, each of the at least one contact plug having a first end directly and vertically connected to a p-region or an n-region of a corresponding one of the photodetectors and a second end directly connected to a gate or a source of one of the at least one first pixel MOS transistor of a corresponding one of the in-pixel amplifier circuitries, the at least one contact plug being made of a semiconductor material,
wherein each of the at least one first pixel MOS transistor has an active region disposed between a gate layer thereof and the first semiconductor substrate.

2. The photosensitive imaging apparatus according to claim 1, wherein the bonding dielectric layer is reflective to light incident through the photosensitive semiconductor layer.

3. The photosensitive imaging apparatus according to claim 2, wherein the bonding dielectric layer is a stacked-structure of silicon dioxide, silicon nitride and silicon dioxide, the bonding dielectric layer, the photosensitive semiconductor layer and the pixel-circuitry semiconductor layer providing Bragg reflection for the light incident through the photosensitive semiconductor layer.

4. The photosensitive imaging apparatus according to claim 1, wherein the at least one contact plug extending through the bonding dielectric layer is formed of any one of silicon, germanium, gallium, arsenic, graphene and diamond, or a combination thereof.

5. The photosensitive imaging apparatus according to claim 1, wherein the photodetectors are photodiodes and each of the at least one contact plug has the first end physically connected to a p-region or an n-region of a corresponding one of the photodiodes.

6. The photosensitive imaging apparatus according to claim 1, wherein the photosensitive semiconductor layer comprises a mesh structure of insulating spacers for electrically isolating each one of the photodetectors from adjacent ones of the photodetectors, and wherein the insulating spacers are reflective to residual optical radiation within the photodetectors surrounded thereby.

7. The photosensitive imaging apparatus according to claim 1, wherein the at least one first pixel MOS transistor includes a charge transfer switch, the charge transfer switch having a source acting as an input of a corresponding one of the in-pixel amplifier circuitries and being physically and electrically connected to the second end of a corresponding one of the at least one contact plug, the charge transfer switch having a gate electrically connected to an interconnection for charge transfer control.

8. The photosensitive imaging apparatus according to claim 1, wherein each of the in-pixel amplifier circuitries further comprises a pixel switch transistor, the pixel switch transistor having one of a source and a drain electrically connected to the second end of a corresponding one of the at least one contact plug, the pixel switch transistor having a gate electrically connected to an interconnection for pixel control, the pixel switch transistor having the other of the source and the drain electrically connected to a reset-voltage load.

9. The photosensitive imaging apparatus according to claim 1, wherein the at least one first pixel MOS transistor includes a source-follower amplifier transistor, the source-follower amplifier transistor having a gate physically and electrically connected to the second end of a corresponding one of the at least one contact plug, the source-follower amplifier transistor having a source electrically connected to an interconnection for a constant-voltage load.

* * * * *